United States Patent
Talegaonkar et al.

(10) Patent No.: US 9,294,051 B2
(45) Date of Patent: Mar. 22, 2016

(54) METHOD AND APPARATUS FOR IMPLEMENTING WIDE DATA RANGE AND WIDE COMMON-MODE RECEIVERS

(71) Applicant: Lattice Semiconductor Corporation, Portland, OR (US)

(72) Inventors: Mrunmay Talegaonkar, Champaign, IL (US); Srikanth Gondi, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 20 days.

(21) Appl. No.: 14/209,785

(22) Filed: Mar. 13, 2014

(65) Prior Publication Data
US 2014/0266450 A1    Sep. 18, 2014

Related U.S. Application Data

(60) Provisional application No. 61/801,605, filed on Mar. 15, 2013.

(51) Int. Cl.
| | |
|---|---|
| H03F 3/16 | (2006.01) |
| H03F 3/45 | (2006.01) |
| G11C 7/06 | (2006.01) |
| G11C 7/08 | (2006.01) |

(52) U.S. Cl.
CPC *H03F 3/16* (2013.01); *G11C 7/062* (2013.01); *G11C 7/065* (2013.01); *G11C 7/08* (2013.01); *H03F 3/45264* (2013.01)

(58) Field of Classification Search
CPC .......................... G11C 7/065; H03F 3/45264
USPC ........... 327/51, 52, 54, 55, 56, 57, 63, 65, 67, 327/68, 77, 78, 87, 88, 89
See application file for complete search history.

(56) References Cited

U.S. PATENT DOCUMENTS

| | | | |
|---|---|---|---|
| 6,147,514 A * | 11/2000 | Shiratake | 327/55 |
| 6,204,697 B1 | 3/2001 | Zerbe | |
| 6,392,449 B1 * | 5/2002 | Taft | 327/55 |
| 6,426,656 B1 | 7/2002 | Dally et al. | |
| 6,847,234 B2 * | 1/2005 | Choi | 327/65 |
| 7,193,447 B1 | 3/2007 | Liu et al. | |
| 2007/0115031 A1 | 5/2007 | Hsu et al. | |
| 2008/0222227 A1 * | 9/2008 | Chiang | 708/209 |
| 2011/0079923 A1 * | 4/2011 | Suh | 257/777 |
| 2011/0140741 A1 | 6/2011 | Zerbe et al. | |

OTHER PUBLICATIONS

Nikolic, B. et al., "Improved Sense-Amplifier-Based Flip-Flop: Design and Measurements." IEEE Journal of Solid-State Circuits, Jun. 2000, pp. 876-884, vol. 35, No. 6.
PCT International Search Report and Written Opinion, PCT Application No. PCT/US2014/026187, Aug. 14, 2014, 8 pages.
Yuan, J. et al., "New Single-Clock CMOS Latches and Flipflops with Improved Speed and Power Savings." IEEE Journal of Solid-State Circuits, Jan. 1997, pp. 62-69, vol. 32, No. 1.

* cited by examiner

*Primary Examiner* — Jung Kim
(74) *Attorney, Agent, or Firm* — Fenwick & West LLP

(57) ABSTRACT

Embodiments of disclosed configurations include a circuit and system for a sense amplifier having a sensing circuit changing an output voltage at an output node based on a time that is defined by the output voltage reaching a threshold voltage level. The sensing circuit changes the output voltage at the output node before the time. In addition, a regeneration circuit amplifies the changed output voltage at the time. The sense amplifier offers sufficient voltage headroom to improve operation speed and power efficiency.

11 Claims, 13 Drawing Sheets

METHOD AND APPARATUS FOR IMPLEMENTING WIDE DATA RANGE AND WIDE COMMON-MODE RECEIVERS

CROSS-REFERENCE TO RELATED APPLICATION

This application claims priority under 35 U.S.C. §119(e) to U.S. Provisional Patent Application No. 61/801,605 filed on Mar. 15, 2013, which is incorporated by reference herein in their entirety.

BACKGROUND

1. Field of Art

This disclosure generally relates to wired communications in electronic devices and, more particularly, to a sense amplifier implemented in a receiving device.

2. Description of the Related Art

Many electronic systems include integrated circuits (chips) that communicate with each other. For example in a computer, integrated circuits such as a dynamic random access memory (DRAM) communicate with a central processing unit (CPU), and graphics processing unit (GPU). To enable communication between two or more different integrated circuits, a transmitter in one integrated circuit transmits signals to a receiver in another integrated circuit via an interconnect.

Generally, a receiver structure (or circuit) is limited in terms of input speed (or frequency) range because the conventional receiver structure is optimized either for receiving high-speed or low-speed signals. Therefore, to receive wide speed range of input signal, multiple receivers are employed in the conventional receiver structure, where each receiver is optimized for a different operating speed. This results in an increased overall area and, hence, cost of implementation.

Moreover, many receiver structures suffer from insufficient voltage headroom because of low supply voltages used in advanced fabrication processes. As a result, these receiver structures operate with a narrow input common mode range, and dissipate high power from the power supply. In addition, the insufficient voltage headroom in such receiver structures tend to result in poor data rates, bit error rates, sensitivity to supply noise, and lack of flexibility in input signal swing.

SUMMARY

Embodiments relate to a sense amplifier having a sensing circuit changing an output voltage at an output node based on a time that is defined by the output voltage reaching a threshold voltage level. The sensing circuit receives an input signal when a clock signal is placed in a first state. The sensing circuit changes an output voltage at an output node based on the input signal before the time.

The sense amplifier may include a power switch coupled between a first reference voltage source at a first voltage level and a second reference voltage source at a second voltage level lower than the first voltage level. The power switch enables current to flow from the first reference voltage source to the second reference voltage source in the sense amplifier when a clock signal is placed in the first state. In addition, the sense amplifier includes a sensing circuit coupled in series with the power switch.

The sense amplifier may include a regeneration circuit coupled in parallel to the sensing circuit and in series with the power switch. The regeneration circuit amplifies the changed output voltage at the time when the clock signal is placed in the first state. The output voltage reaches the threshold voltage level based on the current flowing from the first reference voltage source to the second reference voltage source.

In one embodiment, the sense amplifier may include a reset circuit. The reset circuit is coupled to the output node. The reset circuit sets the output voltage at the output node to a predetermined voltage level responsive to the clock signal placed in a second state.

In one embodiment, the regeneration circuit may amplify the changed output voltage at the time. The time is not based on any additional clock signal.

In one embodiment, the sensing circuit may include a transistor coupled to the output node in series with the power switch and increase or decrease the output voltage based on the input signal.

In one embodiment, the sensing circuit may include a sensing current control circuit coupled in series with the sensing circuit. The sensing current control circuit controls degree of change in the output voltage caused by operation of the sensing circuit.

In one embodiment, the regeneration circuit may include cross coupled transistors. A regeneration port of the cross coupled transistors is coupled to the output node.

In one embodiment, the regeneration circuit may include a regeneration current control circuit coupled in series with the power switch and the regeneration circuit. The regeneration current control circuit determines current through the regeneration circuit.

In one embodiment, the regeneration circuit may include a self clock control circuit. The self clock control circuit turns off the power switch responsive to the output voltage at the output node reaching a holding voltage level. The output node is coupled to an input of the self clock control circuit. The output of the self clock control circuit is coupled to a control terminal of the power switch.

In one embodiment, the sense amplifier may include an assisted charging circuit. The assisted charging circuit is coupled to the output node and assists the output voltage reaching the threshold voltage level.

In one embodiment, the sense amplifier may include an external reference control circuit. The external reference control circuit provides a reference signal to the sensing circuit. The sensing circuit changes the output voltage based on the input signal and the reference signal.

In one embodiment, the output node of the sense amplifier is coupled to an input of another sense amplifier. Another sense amplifier generates another output voltage at another output node.

Embodiments also relate to a method of operating a sense amplifier having a sensing circuit changing an output voltage at an output node based on a time that is defined by the output voltage reaching a threshold voltage level. In one embodiment, a method of amplifying an input signal by a sense amplifier is disclosed. The method includes placing the sense amplifier in an evaluation phase responsive to a clock signal transitioning to a first state from a second state to enable current through a power switch in the sense amplifier. The method also includes changing an output voltage at an output node of the sense amplifier based on the current through the power switch and the input signal sensed by a sensing circuit in the evaluation phase. In addition, the method includes placing the sense amplifier in a regeneration phase responsive to the output voltage at the output node reaching a threshold voltage level. The output voltage reaches the threshold voltage level based on the current through the power switch in the evaluation phase. The regeneration phase is subsequent to the evaluation phase. The clock signal is in the first state in the regeneration phase. Additionally, the method includes amplifying the changed output voltage from the sensing circuit in the regeneration phase. Moreover, the method includes placing the sense amplifier in a reset phase responsive to the clock signal transitioning from the first state to the second state. Furthermore, the method includes resetting, by a reset circuit, the output voltage at the output node in the reset phase.

In one embodiment, the method may include controlling a degree of change in the output voltage caused by the sensing circuit using a sensing current control circuit. The method may also include controlling a degree of amplification of the changed output voltage caused by the regeneration circuit using a regeneration current control circuit. The method may also include changing the output voltage at the output node to reach the threshold voltage level using an assisted charging circuit coupled to the output node by allowing additional current through the output node.

In one embodiment, the method may include placing the sense amplifier in a hold phase responsive to the output voltage at the output node reaching a holding voltage level. The method also includes maintaining the amplified output voltage within a range in the hold phase.

In one embodiment, the method may include generating a self clock signal based on the output voltage at the output node. The method also includes disabling the current through the power switch based on the self clock signal in the hold phase.

Embodiments also related to an electronic device including the sense amplifier.

Embodiment also relate to a non-transitory computer readable medium storing a representation of the sense amplifier.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only.

Configuration Overview

Embodiments relate to a sense amplifier having a sensing circuit changing an output voltage at an output node based on a regeneration start time that is defined by the output voltage reaching a threshold voltage level. The sensing circuit changes the output voltage at the output node before the regeneration start time. In addition, a regeneration circuit amplifies the changed output voltage at the regeneration start time. The sense amplifier offers sufficient voltage headroom to improve operation speed and power efficiency.

A threshold voltage level described herein refers to a voltage level that triggers the regeneration circuit to amplify a signal at a regeneration port of the regeneration circuit.

A holding voltage level described herein refers to a voltage level at which the amplification from the regeneration circuit discontinues.

Charging a node described herein refers to charging parasitic and/or non-parasitic capacitors associated with the node. Therefore, charging a node results in increase in a voltage at the node.

Discharging a node described herein refers to discharging parasitic and/or non-parasitic capacitors associated with the node. Discharging a node results in decrease in a voltage at the node.

Example Circuit Architecture

Figure 1:
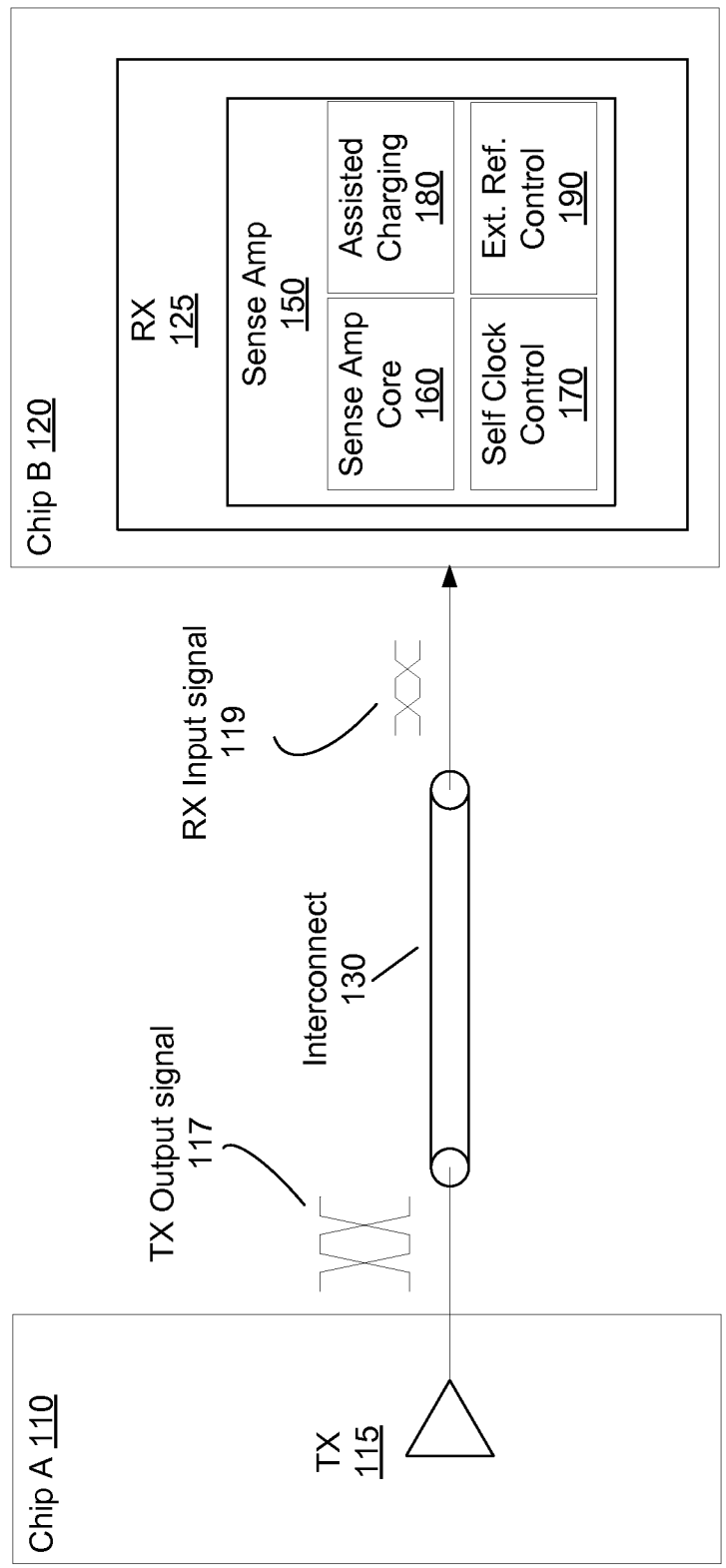
FIG. 1 illustrates a high level system diagram for a chip-to-chip communication, and a sense amplifier is employed as a front end of a receiver chip, according to one embodiment.

FIG. 1 is a diagram illustrating a chip-to-chip interface between two chips, according to one embodiment. Chip A 110 includes a transmitter (TX) 115 to transmit signals over an interconnect 130 to chip B 120 with a receiver (RX) 125. The TX 115 generates TX output signal 117 at an output of the transmitter 115 to drive the interconnect 130 and the RX 125. However, RX input signal 119 received at an input of the receiver 125 is degraded, because of non-idealities such as (i) parasitics in the interconnect, off chip components, bonding wires, and bonding pads, (ii) impedance mismatch, (iii) cross talks, and (iv) external noise. The receiver 125 employs a sense amplifier 150 as a front end of the receiver 125, and amplifies the input signal 119 to a proper level. The amplified signal enables logic operation or process to be performed on and/or off the chip B 120.

The sense amplifier 150 includes, among other components, a sense amplifier core circuit 160. The sense amplifier 150 may also include at least a self clock control circuit 170 and an assisted charging circuit 180 to improve performance of the sense amplifier core circuit 160. The sense amplifier 150 may also include an external reference control circuit 190 to allow operation of the sense amplifier 150 with a single input.

Figure 2:
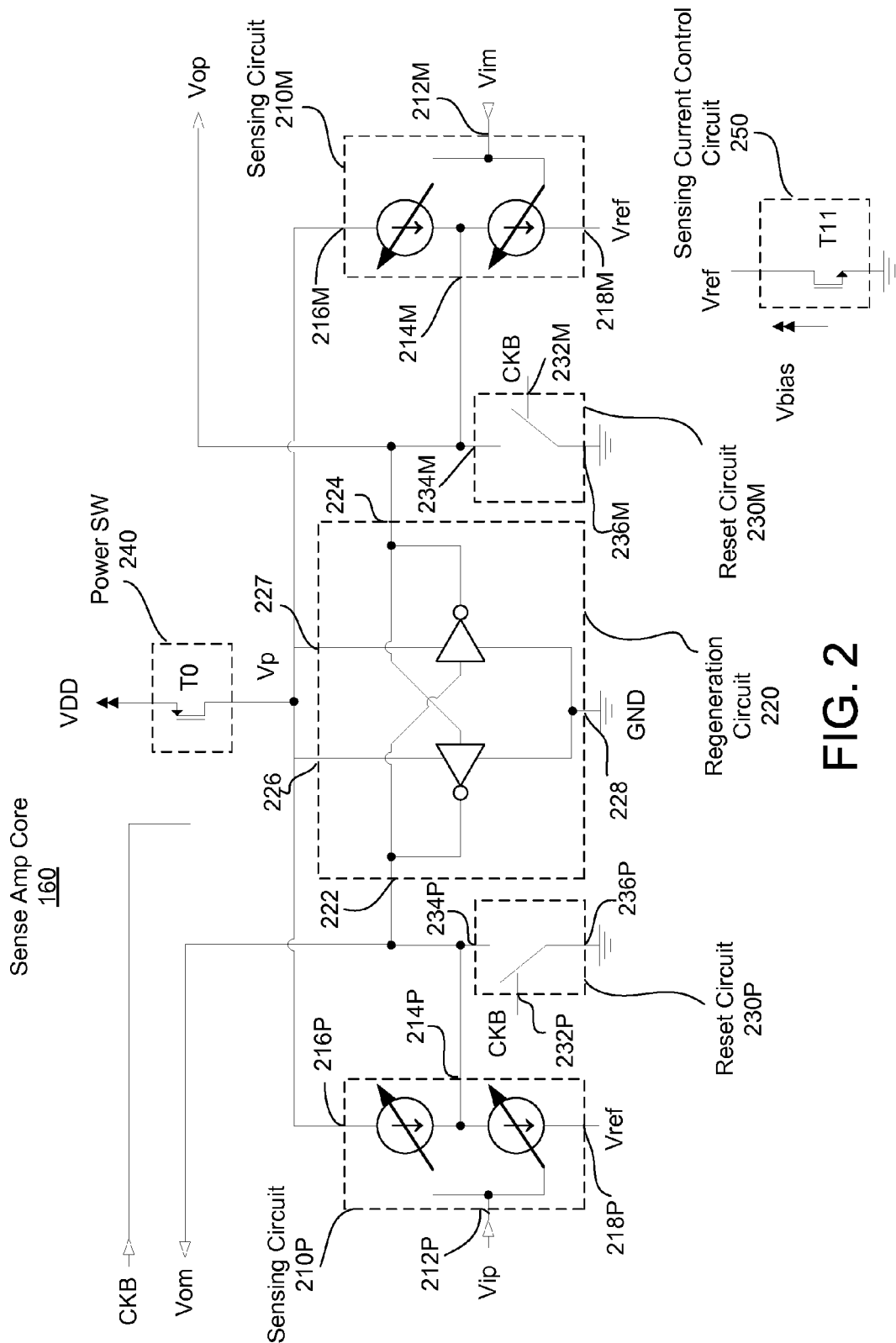
FIG. 2 is a circuit diagram illustrating a sense amplifier core circuit in the sense amplifier, according to one embodiment.
Figure 3:
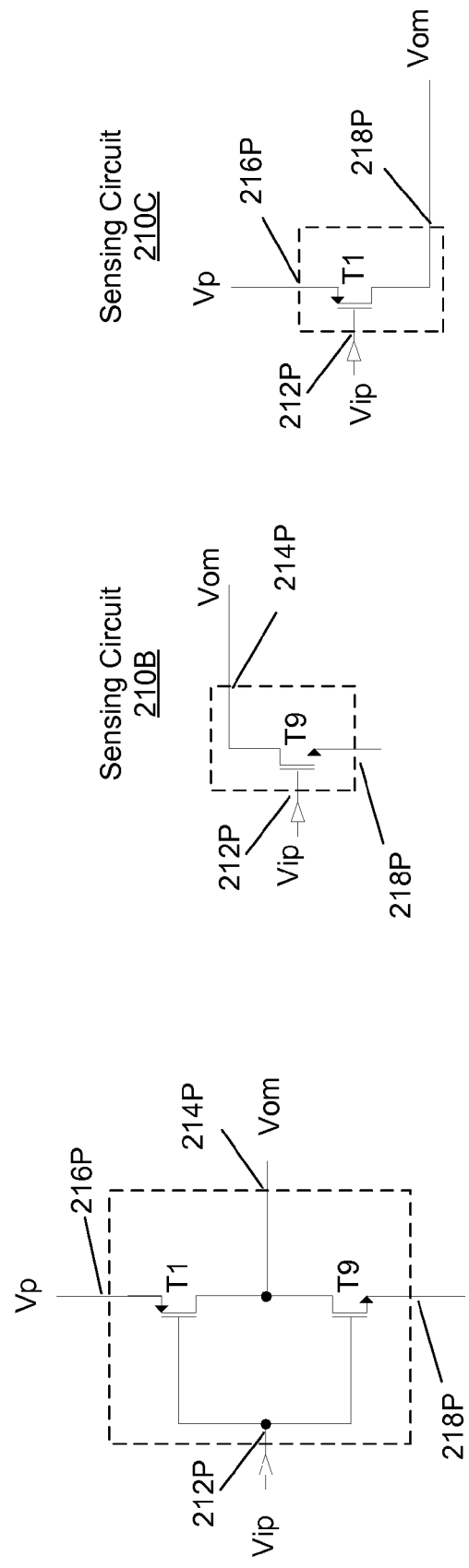
FIGS. 3A, 3B, and 3C are circuit diagrams illustrating sensing circuits according to embodiments.
Figure 4:
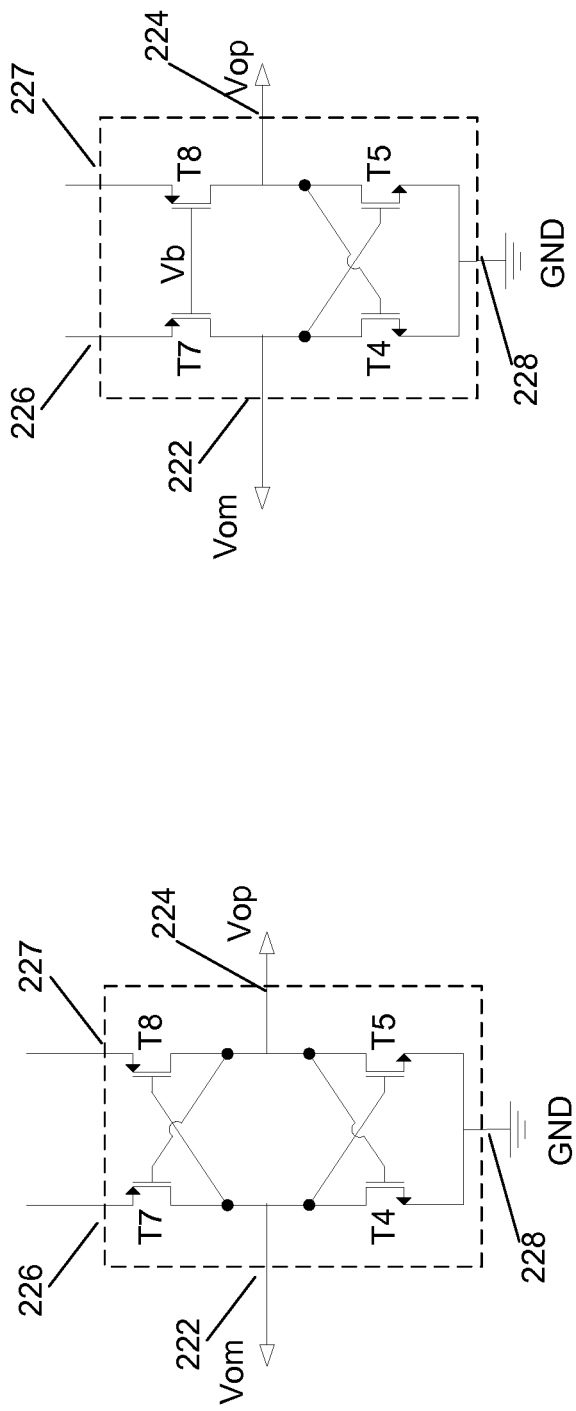
FIGS. 4A and 4B are circuit diagrams illustrating regeneration circuits in the sense amplifier core circuit, according to embodiments.

The sense amplifier core circuit 160 is a core of the sense amplifier 150. In FIG. 2, the sense amplifier core circuit 160 includes a power switch 240, a sensing circuit 210P, 210M (collectively referred to herein as "the sensing circuit 210"), a regeneration circuit 220, and a reset circuit 230P, 230M (collectively referred to herein as "the reset circuit 230"). The sense amplifier core circuit 160 operates in multiple phases based on one clock signal: a reset phase, an evaluation phase, a regeneration phase, and a hold phase.

In the reset phase, the power switch is turned off. In the reset phase, the sense amplifier core circuit 160 pre-charges a positive output node Vop and a negative output node Vom (collectively referred to herein as "the output node Vout") of the sense amplifier core circuit 160 to a predetermined level by discharging the output node Vout with the reset circuit 230. In the evaluation phase, the power switch is turned on, and the power switch 240 charges the output node Vout of the sense amplifier core circuit 160. In addition, the sense amplifier core circuit 160 senses the input signal 119 with the sensing circuit 210 and changes output voltage at the output node Vout with the sensing circuit 210. In the regeneration phase, the sense amplifier core circuit 160 amplifies the changed output voltage from the sensing circuit 210 at the regeneration start time with the regeneration circuit. The regeneration start time is defined by the output voltage reaching a threshold voltage level. In addition, the power switch is turned on in the regeneration phase. In the holding phase, the sense amplifier core circuit 160 maintains the output voltage at the output node Vout in the holding voltage level. The structure and operation of the self clock control circuit 170 are described in detail below with reference to FIGS. 2 through 6.

The self clock control circuit 170 determines whether the sense amplifier core circuit 160 is in the hold phase. The self clock control circuit 170 also controls the power switch 240 in the sense amplifier core circuit 160 to eliminate power consumption in the hold phase. The structure and operation of the self clock control circuit 170 are described in detail below with reference to FIG. 7.

The assisted charging circuit 180 enables the output voltage at the output node Vout of the sense amplifier core circuit 160 to reach the threshold voltage level faster. The assisted charging circuit 180 allows additional current through the output node Vout regardless of the clock signal. The assisted charging circuit 180 includes a current source coupled to the output node Vout. The structure and operation of the self clock control circuit 170 are described in detail below with reference to FIG. 8.

The external reference control circuit 190 enables a reference signal to be applied in the sense amplifier core circuit 160. The external reference control circuit 190 includes pass transistors and reference reset transistors. The structures and operations of these components are described in detail below with reference to FIG. 9.

Referring to FIG. 2, illustrated is one embodiment of a sense amplifier core circuit 160 to sense input signal Vin as a front-end of the RX. The sense amplifier core circuit 160 comprises a power switch 240, a positive input sensing circuit 210P and a negative input sensing circuit 210M ("collectively referred to herein as a "sensing circuit 210"), a regeneration circuit 220, and a positive reset circuit 230P and a negative reset circuit 230M (collectively referred to herein as a "reset circuit 230").

The sense amplifier core circuit 160 receives, at the sensing circuit 210, a differential input signals Vin comprising: a positive input signal Vip and a negative input signal Vim. In addition, the sense amplifier core circuit 160 receives an inverted clock signal CKB to control the power switch 240, and the reset circuit 230. Additionally, the sense amplifier core circuit 160 may determine strength of the sensing circuit 210 using a sensing current control circuit 250.

The power switch 240 is coupled, between a first reference voltage source (VDD) at a first voltage level and a second reference voltage source (GND) at a second voltage level lower than the first voltage level, to the sensing circuit 210 and the regeneration circuit 220 in series at a common node Vp. In this configuration, the power switch 240 enables current to flow from VDD to GND through the sensing circuit 210 and the regeneration circuit 220, responsive to the inverted clock signal CKB placed in LOW state or a non-inverted clock signal CK placed in HIGH state. The power switch 240 enables the output node Vout of the sense amplifier core circuit 160 to reach a threshold voltage level from a predetermined voltage level.

In one embodiment, the power switch 240 can be implemented with a PMOS transistor T0. For example, a control terminal (i.e., gate) of the PMOS transistor T0 is coupled to the inverted clock signal CKB. A source terminal of the PMOS transistor T0 is coupled to VDD and a drain terminal of the PMOS transistor T0 is coupled to the common node Vp. In this configuration, the PMOS transistor T0 is turned on and conducts current, if the inverted clock signal CKB is in LOW state. The PMOS transistor T0 may operate as a switch in a linear region to pull up a voltage level at the common node Vp to VDD, when the PMOS transistor T0 is turned on. Alternatively, the PMOS transistor T0 may operate as a current source in a saturation region to regulate current through the sense amplifier core circuit 160, when the PMOS transistor T0 is turned on.

The sensing circuit 210 is coupled in series with the power switch 240 to sense the input signal Vin, when the power switch 240 is turned on. In the evaluation phase, the sensing circuit 210 changes the positive output voltage at the positive output node Vop and the negative output voltage at the negative output node Vom, based on a voltage level difference between the positive input signal Vip and the negative input signal Vim. The positive input sensing circuit 210P receives the positive input signal Vip at an input terminal 212P, and the negative input sensing circuit 210M receives the negative input signal Vim at an input terminal 212M, respectively.

An output terminal 214P of the positive input sensing circuit 210P is coupled to a negative output node Vom of the sense amplifier core circuit 160. Likewise, an output terminal 214M of the negative input sensing circuit 210M is coupled to a positive output node Vop of the sense amplifier core circuit 160. A first current terminal 216P of the positive input sensing circuit 210P and a first current terminal 216M of the negative input sensing circuit 210M are coupled to the common node Vp in series with the power switch 240. A second current terminal 218P of the positive input sensing circuit 210P and a second current terminal 218M of the negative input sensing circuit 210M are coupled to a reference node Vref. In one embodiment, the reference node Vref is coupled to GND.

Alternatively, the reference node Vref is coupled to the sensing current control circuit 250.

In the embodiment of FIG. 2, the positive input sensing circuit 210P charges the negative output node Vom by injecting current through the first current terminal 216P to the output terminal 214P, according to the positive input signal Vip received at the input terminal 212P. Additionally or alternatively, the positive input sensing circuit 210P discharges the negative output node Vom by sinking current through the output terminal 214P to the second current terminal 218P, according to the positive input signal Vip received at the input terminal 212P. The negative input sensing circuit 210M operates under similar principle with the negative input voltage Vim, the positive output voltage Vop, the input terminal 212M, first current terminal 216M, output terminal 214M, and second current terminal 218M of the negative input sensing circuit 210M.

In one embodiment, the sensing current control circuit 250 is coupled to the sensing circuit 210 at the reference node Vref. The sensing current control circuit 250 controls current through the sensing circuit 210 depending on a voltage level at a current control node Vbias. In addition, the sensing current control circuit 250 isolates GND and the sensing circuit 210. The sensing current control circuit 250 can be implemented using a NMOS transistor T11, and a control (i.e., gate) terminal of the sensing current control circuit 250 is coupled to the current control node Vbias. Also, a drain terminal of the NMOS transistor T11 is coupled to the reference node Vref, and the source terminal of the NMOS transistor T11 is coupled to GND. The current control node Vbias may be coupled to a bias circuit or a bias voltage source to control current through the reference node Vref. Alternatively, the current control node Vbias is coupled to VDD.

The regeneration circuit 220 is coupled in parallel to the sensing circuit 210 and in series with the power switch 240. The regeneration circuit 220 amplifies the changed output voltage from the sensing circuit 210 at the regeneration start time in the regeneration phase. Specifically, a first regeneration port 222 is coupled to the negative output node Vom and a second regeneration port 224 is coupled to the positive output node Vop. A first current injection port 226 and a second current injection port 227 are coupled to the common node Vp. Moreover, a current depletion port 228 is coupled to GND. The regeneration circuit 220 amplifies the changed output voltages at the positive output node Vop and the negative output node Vom from the sensing circuit 210. The amplification from the regeneration circuit 220 continues until the output voltages at the positive output node Vop and the negative output node Vom reach the holding voltage levels. In the hold phase, the regeneration circuit 220 maintains the output voltages at the positive output node Vop and the negative output node Vom at the holding voltage levels within a range.

The reset circuit 230 operates to reset the output voltage at the output node Vout to a predetermined level in the reset phase. The reset circuit 230 includes the positive reset circuit 230P and the negative reset circuit 230M. A reset terminal 234P of the positive reset circuit 230P is coupled to the negative output node Vom and a reset terminal 234M of the negative reset circuit 230M is coupled to the positive output node Vop. Moreover, a pre-charge terminal 236P of the positive reset circuit 230P and a pre-charge terminal 236M of the negative reset circuit 230M (collectively referred to herein as "pre-charge terminal 236") are coupled to GND. In one embodiment, each reset circuit 230 is a NMOS transistor used as a switching element that operates with the inverted clock signal CKB. Therefore, when the inverted clock signal CKB is in HIGH state, the reset circuit 230 discharges the positive output node Vop and the negative output node Vom to the second voltage level of GND. Alternatively, the pre-charge terminal 236 is coupled to another node with a predetermined voltage level. In such case, when the inverted clock signal CKB is in HIGH state, the reset circuit 230 discharges the positive output node Vop and the negative output node Vom to the predetermined voltage level.

FIG. 3A is a block diagram illustrating the sensing circuit 210A comprising a NMOS transistor T9 and a PMOS transistor T1, according to one embodiment. By way of illustration, the sensing circuit 210A is embodied as a positive input sensing circuit 210P. The input terminal 212P of the sensing circuit 210A is coupled to a gate terminal of the PMOS transistor T1 and a gate terminal of the NMOS transistor T9. A source terminal of the PMOS transistor T1 is coupled to a first current terminal 216P of the sensing circuit 210A, and a source terminal of the NMOS transistor T9 is coupled to a second current terminal 218P of the sensing circuit 210A. The drain terminals of the PMOS transistor T1 and the NMOS transistor T9 are coupled to an output terminal 214P of the sensing circuit 210A.

The NMOS transistor T9 is coupled to the output node Vom in series with the power switch 240 and configured to decrease the negative output voltage at the negative output node Vom based on the positive input signal Vip. The PMOS transistor T1 is coupled to the output node Vom in series with the power switch 240 and configured to increase the negative output voltage at the negative output node Vom based on the positive input signal Vip. The negative input sensing circuit 210M can be similarly implemented with respect to the negative input signal Vim, and the positive output node Vop, and therefore, the detailed description thereof is omitted herein for the sake of brevity. With the combination of the PMOS transistor T1 and the NMOS transistor T9, the sensing circuit 210A senses input signals with rail-to-rail input common mode level.

FIG. 3B is a circuit diagram illustrating the sensing circuit 210B, according to another embodiment. The operation and configuration of the sensing circuit 210B is similar to the sensing circuit 210A, except that the sensing circuit 210B comprises the NMOS transistor T9 from the sensing circuit 210A without the PMOS transistor T1. Hence, the sensing circuit 210B can be used to detect the input signal Vin with a high common mode level. All elements shown in FIG. 3B are the same as FIG. 3A.

FIG. 3C is a circuit diagram illustrating the sensing circuit 210C, according to another embodiment. The operation and configuration of the sensing circuit 210C is similar to the sensing circuit 210A, except that the sensing circuit 210C comprises the PMOS transistor T1 from the sensing circuit 210A without the NMOS transistor T9. Hence, the sensing circuit 210C can be used to detect the input signal Vin with a low common mode level. All elements shown in FIG. 3C are the same as FIG. 3A.

FIG. 4A is a circuit diagram illustrating a regeneration circuit 220A, according to one embodiment. The regeneration circuit 220A amplifies the output voltage at the output node Vout in the regeneration phase. The regeneration circuit 220A starts amplification (i.e., regeneration) after the output voltage at the output node Vout reaches the threshold voltage level. The regeneration circuit 220A comprises two cross coupled NMOS transistors T4 and T5, and two cross coupled PMOS transistors T7 and T8. A drain terminal of the NMOS transistor T4 and a drain terminal of the PMOS transistor T7 are coupled to the first regeneration port 222. Similarly, a drain terminal of the NMOS transistor T5 and a drain terminal of the PMOS transistor T8 are coupled to the second regeneration port 224. Source terminals of the NMOS transistors T4 and T5 are coupled to a current depletion port 228. Source terminals of the PMOS transistors T7 and T8 are each coupled to the first current injection port 226 and the second current injection port 227, respectively. The NMOS transistor T4 and the PMOS transistor T7 form a first inverter and the NMOS transistor T5 and the PMOS transistor T8 form a second inverter. Hence, the regeneration circuit 220A can be represented as two back-to-back inverters. Using positive feedback from cross coupled transistors, the regeneration circuit 220A amplifies the positive output voltage at the positive output node Vop and the negative output voltage at the negative output node Vom changed by the operation of the sensing circuit 210.

FIG. 4B is a circuit diagram illustrating a regeneration circuit 220B, according to another embodiment. Regeneration circuit 220B comprises two cross coupled NMOS transistors T4 and T5 and two PMOS transistors T7 and T8. The configuration and the operation of the regeneration circuit 220B are similar to those in the regeneration circuit 220A except that in the regeneration circuit 220B, the PMOS transistors T7 and T8 are not cross coupled with each other. Instead, the gate terminals of the PMOS transistors T7 and T8 are coupled to a regeneration control bias Vb. That is, the PMOS transistor T7 and the NMOS transistor T4 form a first pseudo inverter. Also, the PMOS transistor T8 and the NMOS transistor T5 form a second pseudo inverter. Thus, the regeneration circuit 220B can be represented as two back-to-back pseudo inverters. Depending on the regeneration control bias Vb, current through the regeneration circuit 220B is determined. Hence, the PMOS transistors T7 and T8 operate as a regeneration current control circuit, coupled in series with the power switch and the regeneration circuit. In one embodiment, the regeneration control bias Vb may be coupled to GND. Alternatively, the regeneration control bias Vb may be coupled to any biasing circuit or a voltage source to provide an appropriate control voltage at the gates of the PMOS transistors T7 and T8.

Embodiments have many advantages including, but not limited to, (i) enabling sufficient voltage head room by employing only two stacked PMOS and NMOS devices, (ii) achieving power efficiency and speed improvement because of the sufficient voltage headroom, (iii) achieving simple clocking scheme in the design process by operating only 3 clocked transistors T0, T3, and T6 with a single clock signal, and (iv) allowing flexibility in operating with either a single ended signal or differential input signals with the positive input circuit 210A and the negative input circuit 210B.

Example Configuration and Operation of Sense Amplifier

Figure 5:
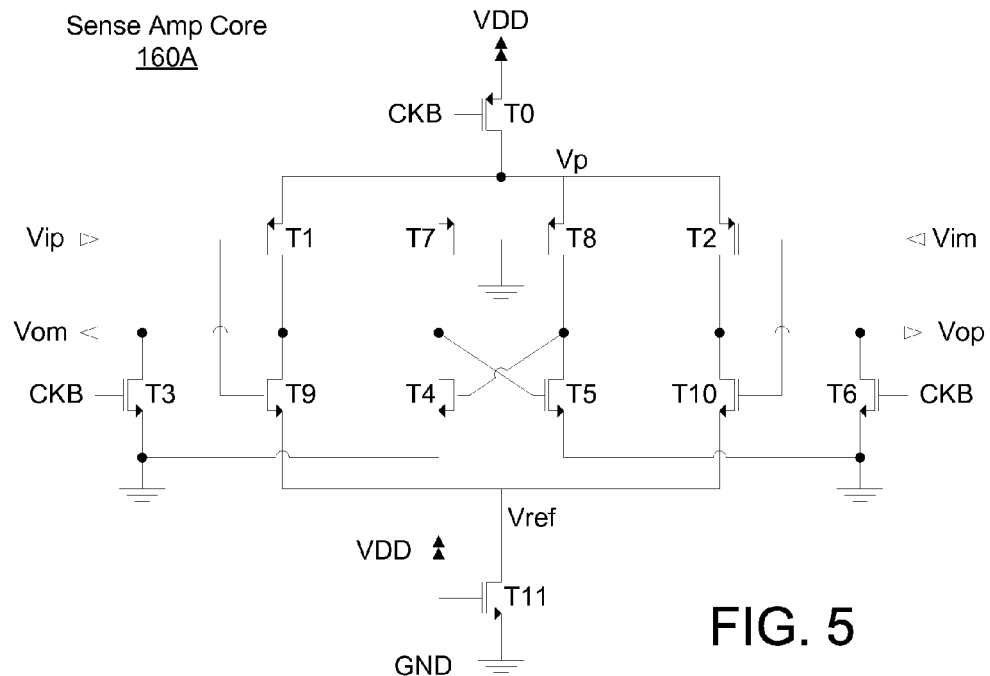
FIG. 5 is a circuit diagram illustrating a sense amplifier core circuit with a pseudo inverter as a regeneration circuit and NMOS input transistors as sensing circuits, according to one embodiment.

Referring to FIG. 5, illustrated is an example embodiment of a sense amplifier core circuit 160A. The configuration and operation of the embodiment of FIG. 5 is substantially the same as the embodiment of FIG. 2 except that the positive input sensing circuit 210P is replaced with the sensing circuit 210A, the negative input sensing circuit 210M is replaced with the sensing circuit 210A, and the regeneration control bias Vb is coupled to GND.

The sensing circuit 210A includes the NMOS transistor T1 and the PMOS transistor T9, where the current control node Vbias of the NMOS transistor T11 is coupled to VDD. Similarly, the sensing circuit 210A comprises a NMOS transistor T2 and the PMOS transistor T10. In addition, the back-to-back pseudo inverters in the regeneration circuit 220B are employed as the regeneration circuit 220 in FIG. 2.

Figure 6:
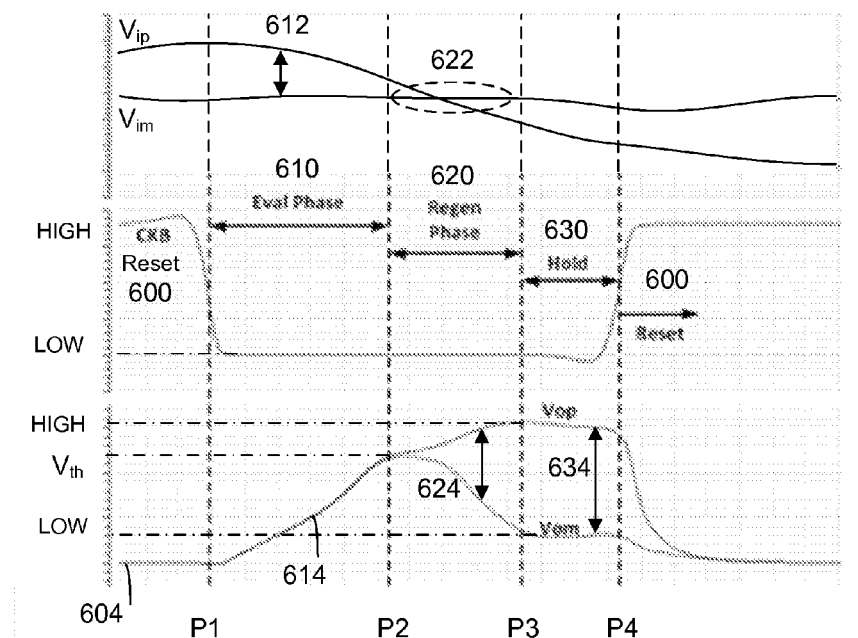
FIG. 6 is a timing diagram illustrating an example operation of the sense amplifier, according to one embodiment.

FIG. 6 is a timing diagram illustrating an example operation of the sense amplifier in FIG. 5, according to one embodiment. Specifically, FIG. 6 illustrates a timing diagram generated using Simulation Program with Integrated Circuit Emphasis (SPICE) on the sense amplifier core circuit 160A of FIG. 5. In FIG. 6, the negative input signal Vim is coupled to a reference input voltage source, and the positive input signal Vip is coupled to the interconnect 130.

Initially, the sense amplifier core circuit 160A operates in a reset phase 600. The inverted clock signal CKB is in HIGH state, and the positive output node Vop and the negative output node Vom are pre-charged to a predetermined level 604. In this example, the predetermined level 604 is equal to the voltage level of GND.

At a sensing start time P1, the inverted clock signal CKB transitions to LOW state, and the sense amplifier core circuit 160A enters the evaluation phase 610. In the evaluation phase 610, the power switch T0 enables current to flow through the positive output node Vop and the negative output node Vom. Therefore, the sense amplifier core circuit 160A charges 614 the positive output node Vop and the negative output node Vom from GND. Based on the difference 612 between the positive input signal Vip and the negative input signal Vim, the positive output voltage at the positive output node Vop and the negative output voltage at the negative output node Vom are charged differentially. That is, the sensing circuit changes the positive output node Vop and the negative output node Vom. In this example, the positive output voltage at the positive output node Vop is slightly greater than the negative output voltage at the negative output node Vom based on the difference between the positive input signal Vip and the negative input signal Vim.

At a regeneration start time P2, the positive output voltage at the positive output node Vop and the negative output voltage at the negative output node Vom reach a threshold voltage level Vth of the regeneration circuit 220B. Therefore, the regeneration circuit 220B separates 624 the positive output node Vop and the negative output node Vom, respectively, to HIGH and LOW states through the regeneration process. In one embodiment, the strength of the regeneration circuit 220B is stronger than the drive strength of the sensing circuit 210. Therefore, once the sense amplifier core circuit 160A enters the regeneration phase, glitches or changes 622 in the input signals do not affect the output signals.

At a holding start time P3, the positive output voltage at the output node Vop and the negative output voltage at the output node Vom are relatively stable 634 at holding voltage levels corresponding to either HIGH or LOW state. Subsequently, the sense amplifier core circuit 160A enters the hold phase 630. In the hold phase 630, the positive output voltage at the positive output node Vop and the negative output voltage at the negative output node Vom can reliably be sampled by a succeeding flip-flop or a latch for further logic operation.

At a reset start time P4, the inverted clock signal CKB transitions from LOW to HIGH, and the sense amplifier core circuit 160A enters the reset phase 600. In the reset phase 600, the positive output voltage at the positive output node Vop and the negative output voltage at the negative output node Vom are reset to the predetermined level 604. Accordingly, the sense amplifier core circuit 160A iteratively enters the reset phase 600, the evaluation phase 610, the regeneration phase 620 and the hold phase 630 based on the state of the inverted clock signal CKB (or the non-inverted clock signal CK) without resorting to an additional clock signal.

Additional Circuit Configurations of the Sense Amplifier

Figure 7:
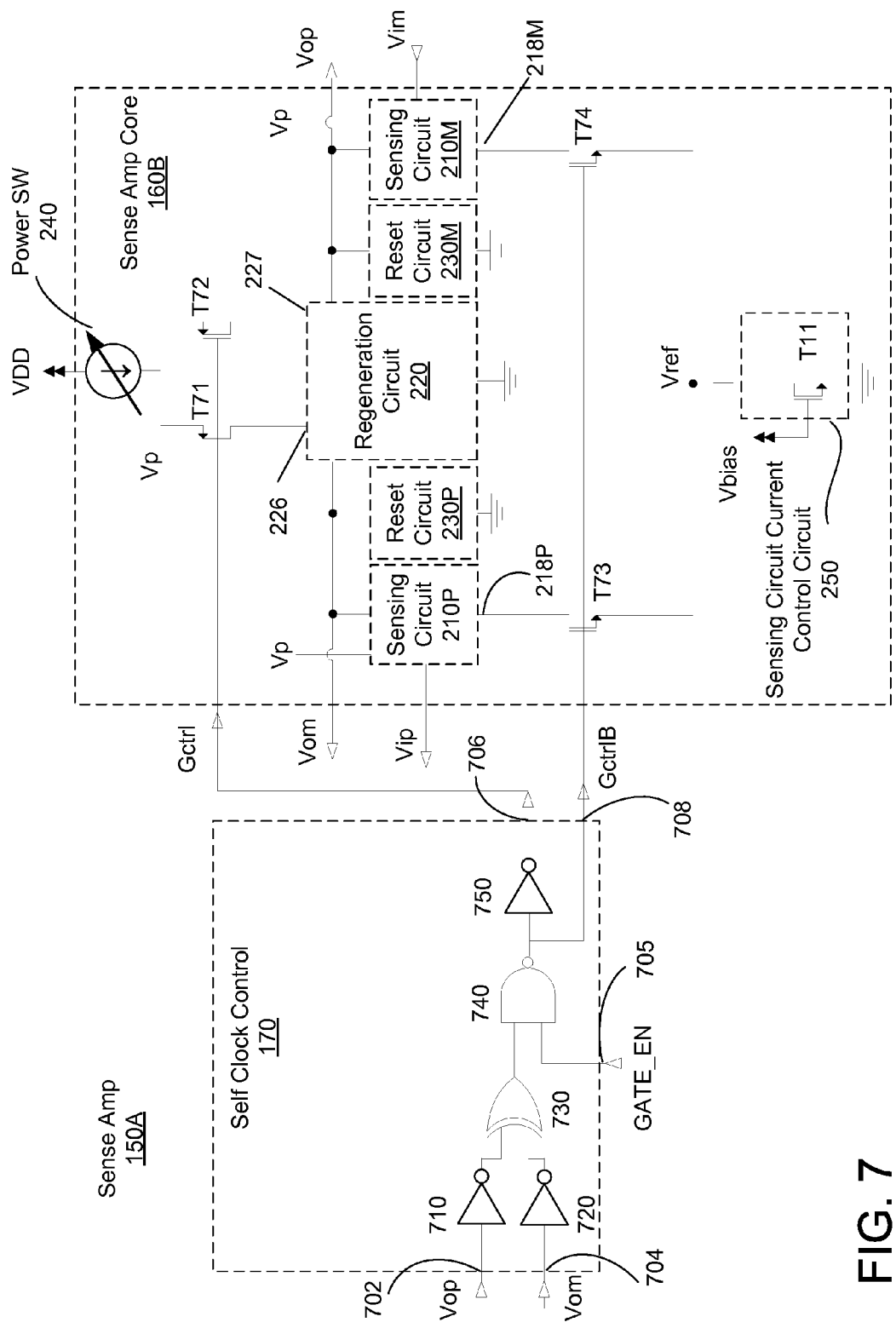
FIG. 7 is a circuit diagram illustrating a sense amplifier with a self clock control circuit, according to one embodiment.

Referring to FIG. 7, illustrated is a sense amplifier 150A including a sense amplifier core circuit 160B and a self clock control circuit 170. The self clock control circuit 170 performs a self clock control feature to eliminate current consumption in the hold phase. Specifically, the self clock control circuit 170 determines the positive output voltage at the positive output node Vop and the negative output voltage at the negative output node Vom are in the holding voltage levels. In addition, the self clock control circuit 170 controls current through the sensing circuit 210 and the regeneration circuit 220 according to the determination that the positive output voltage at the positive output node Vop and the negative output voltage at the negative output node Vom are placed in the holding voltage levels. In one embodiment, the sense amplifier core circuit 160B is similar to the sense amplifier core circuit 160 of FIG. 2, except that the sense amplifier core circuit 160B is modified to receive a current control signal at a Gctrl node and/or an inverted current control signal at a GctrlB node. A positive input clock terminal 702 of the self clock control circuit 170 is coupled to the positive output node Vop, and a negative input clock terminal 704 is coupled to the negative output node Vom. A first output clock control terminal 706 is coupled to the Gctrl node and the second output clock control terminal 708 is coupled to the GctrlB node. A self clock control enable terminal 705 is coupled to the GATE_EN signal to enable or disable the self clock control feature.

In one embodiment, the sensing amplifier core circuit 160B is modified to control current through the sensing circuit 210 and the regeneration circuit 220 as illustrated in FIG. 7. The sense amplifier core circuit 160B is similar to the one in sense amplifier core circuit 160 in FIG. 2, but differ with respect to (i) including of a PMOS transistor T71 coupled between the common node Vp and the first current injection port 226 of the regeneration circuit 220, (ii) including a PMOS transistor T72 coupled between the common node Vp and the second current injection port 227 of the regeneration circuit 220, (iii) including a NMOS transistor T73 coupled between a second current terminal 218P of the positive input sensing circuit 210P and the reference node Vref, and (iv) including a NMOS transistor T74 coupled between a second current terminal 218M of the negative input sensing circuit 210M and the reference node Vref. In the embodiment of FIG. 7, the PMOS transistors T71 and T72 operating as switches can disable current through the regeneration circuit 220. Similarly, the NMOS transistors T73 and T74 operating as switches can disable current through the sensing circuits 210P and 210M, respectively.

In FIG. 7, one embodiment of a self clock control circuit 170 to control the sense amplifier core circuit 160B is illustrated. The self clock control circuit 170 detects differences between the positive output voltage at the positive output node Vop and the negative output voltage at the negative output node Vom to determine whether the positive output voltage and the negative output voltage are at the holding voltage levels. If the self clock control circuit 170 determines that the positive output voltage and the negative output voltage are at the holding voltage levels, the self clock control circuit 170 generates the current control signal at the Gctrl node and the GctrlB node.

The self clock control circuit 170 may include, among other components, inverters 710, 720, and 750, a XOR gate 730 and a NAND gate 740. The inverter 710 and the inverter 720 are each coupled to the positive input clock terminal 702 and the negative input clock terminal 704, respectively. Therefore, the inverter 710 receives the positive output voltage at the positive output node Vop and the inverter 720 receives the negative output voltage at the negative output node Vom. Output nodes of the inverters 710 and 720 are coupled to each input of the XOR gate 730. The output of the XOR gate 730 is coupled to the NAND gate 740. Another input of the NAND gate is coupled to the self clock control enable terminal 705. The output of the NAND gate 740 is coupled to the second output clock control terminal 708 and an input of the inverter 750. The output of the inverter 750 is coupled to the first output clock control terminal 706.

In another embodiment, the self clock control circuit 170 can include other logic circuits to directly control the gate terminals the power switch 240 and the sensing current control circuit 250. Such configuration removes the PMOS transistors T71 and T72, and the NMOS transistors T73 and T74 shown in FIG. 7.

Figure 8:
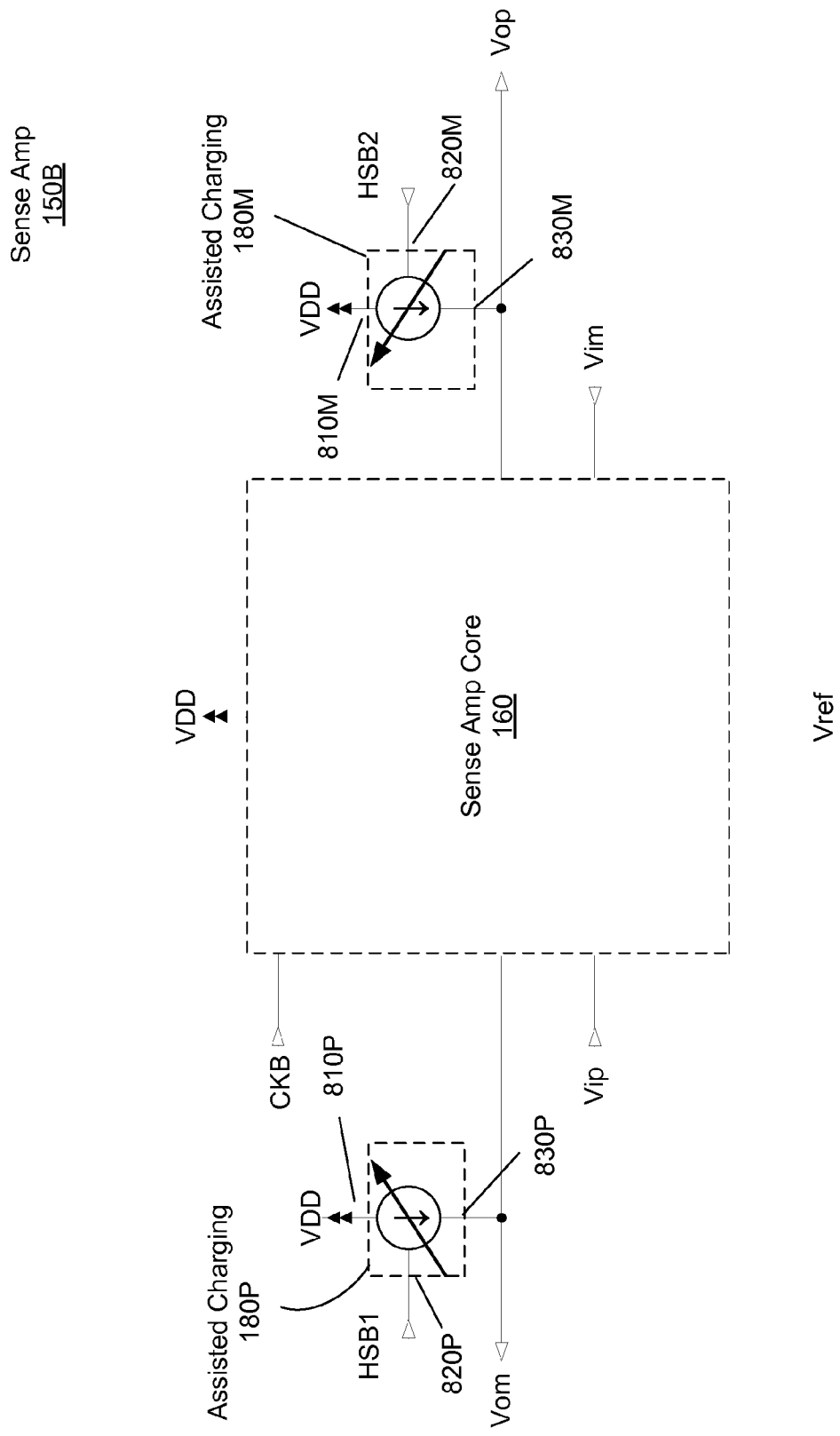
FIG. 8 is a block diagram illustrating a sense amplifier with an assisted charging circuit, according to one embodiment.

FIG. 8 illustrates an assisted charging circuit 180 to charge the output nodes Vop and Vom of the sense amplifier core circuit 160. The sense amplifier core circuit 160 is substantially the same as described above with respect to FIG. 2, and the detailed description thereof is omitted herein for the sake of brevity. The assisted charging circuit 180 injects current into the positive output node Vop and the negative output node Vom based on a first assisted current control HSB1 and a second assisted current control HSB2 to help the sense amplifier core circuit 160 enter the regeneration phase faster.

The assisted charging circuit 180 includes a positive assisted charging circuit 180P and a negative assisted charging circuit 180M. An assisted charging terminal 830P of the positive assisted charging circuit 180P is coupled to the negative output node Vom and an assisted charging terminal 830M of the negative assisted charging circuit 180M is coupled to the positive output node Vop. Moreover, an assisted supply terminal 810P of the positive assisted charging circuit 180P and an assisted supply terminal 810M of the negative assisted charging circuit 180M are coupled to VDD. The first assisted current control HSB1 is coupled to an assisted current control terminal 820P of the positive assisted charging circuit 180P, and the second assisted current control HSB2 is coupled to an assisted current control terminal 820M of the negative assisted charging circuit 180M. In one embodiment, each of the assisted charging circuit 180 is a PMOS transistor used as a current source. A gate terminal of each PMOS transistor is coupled to the assisted current control terminal 820. In this configuration, the positive assisted charging circuit 180P injects current to the negative output node Vom based on the first assisted current control HSB1. Similarly, the negative assisted charging circuit 180M injects current to the positive output node Vop based on the second assisted current control HSB2. The assisted current controls HSB1 and the HSB2 may be coupled to a single voltage source, but not necessarily.

The assisted charging circuit 180 of FIG. 8 enables the output voltages at the output nodes Vop and Vom to reach the threshold voltage level faster by increasing current through the output nodes Vop and Vom. For example, under operating conditions such as slow process corners, high temperature, and/or low supply voltage, it may take longer time for the regeneration process to start at the regeneration circuit 220. For such operating conditions, the assisted charging circuit 180 can improve the operating speed of the sense amplifier core circuit 160 by increasing current through the output nodes Vop and Vom. Additionally, a mismatch at the positive output node Vop and the negative output node Vom can degrade input sensitivity. By individually controlling the positive assisted charging circuit 180P and the negative assisted charging circuit 180M with the assisted current control HSB1 and the assisted current control HSB2 respectively, the mismatch can be compensated.

Figure 9:
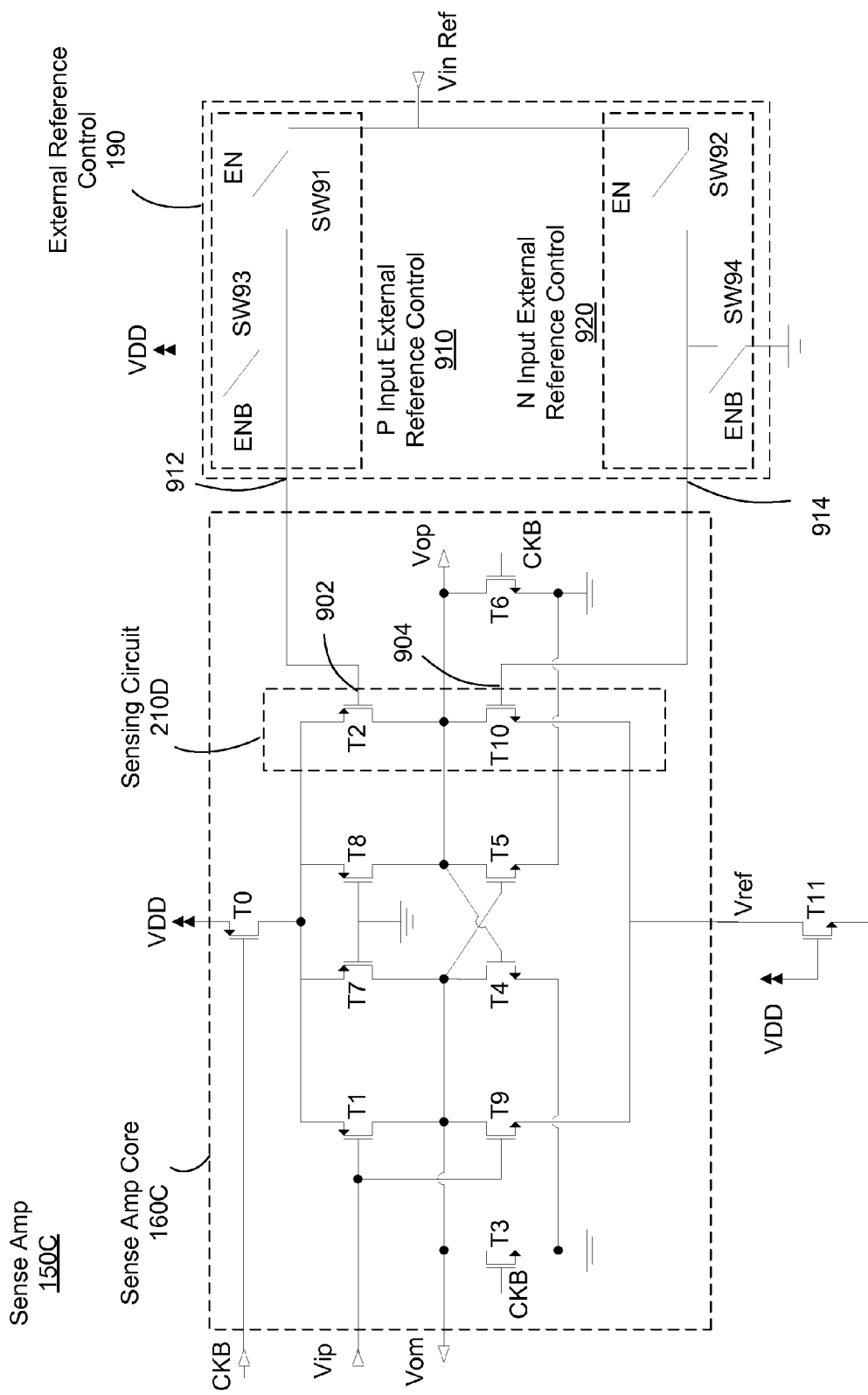
FIG. 9 is a circuit diagram illustrating a sense amplifier with an external reference control circuit, according to one embodiment.

FIG. 9 illustrates a sense amplifier 150C with a sense amplifier core circuit 160C and an external reference control circuit 190, according to one embodiment. The external reference control circuit 190 enables an external reference input feature to allow a reference input voltage source Vin Ref to connect to one of differential input of the sense amplifier core circuit 160C based on an external enable signal EN and/or an inverted external enable signal ENB. The sense amplifier core circuit 160C is similar to the sense amplifier core circuit 160A of FIG. 5, except that the negative input sensing circuit 210M is replaced with a sensing circuit 210D. The sensing circuit 210D is similar to the sensing circuit 210A, except that a gate terminal of the PMOS transistor T2 and a gate terminal of the NMOS transistor T10 are separated.

A first reference terminal 912 of the external reference control circuit 190 is coupled to the gate terminal 902 of the PMOS transistor T2, and a second reference terminal 914 of the external reference control circuit 190 is coupled to the gate terminal 904 of the NMOS transistor T10. If the external reference input feature is enabled, the external reference control circuit 190 receives the reference input voltage source Vin Ref, and provides the voltage level of the reference input voltage source Vin Ref to the sensing circuit 210D of the sense amplifier core circuit 160C. If the external reference input is disabled, the sensing circuit 210D is properly turned off by pulling the gate terminal of the PMOS transistor T2 to VDD and the gate terminal of the NMOS transistor T10 to GND.

In one embodiment, the external reference control circuit 190 comprises a P input external reference control circuit 910 and an N input external reference control circuit 920. The P input external reference control circuit 910 comprises two switching elements SW91 and SW93. If the external enable EN is in HIGH state, the switching element SW91 connects a reference input voltage source Vin Ref to the first reference terminal 912 of the external reference control circuit 190. If the inverted external enable ENB is in HIGH state (i.e., EN is in LOW state), the switching element SW91 disconnects, and the switching element SW93 pulls the first reference terminal 912 of the external reference control circuit 190 to VDD to turn off the PMOS transistor T2. One end of the switching element SW91 is coupled to the reference input voltage source Vin Ref and another end of the switching element SW91 is coupled to the gate terminal 902 of the PMOS transistor T2. In addition, one end of the switching element SW93 is coupled to the gate terminal 902 of the PMOS transistor T2 and another end of the switching element SW93 is couple to VDD.

Similarly, the N input external reference control circuit 920 comprises two switching elements SW92 and SW94. If the external enable EN is in HIGH state, the switching element SW92 connects a reference input voltage source Vin Ref to the second reference terminal 914 of the external reference control circuit 190. If the inverted external enable ENB is in HIGH state, the switching element SW92 disconnects and the switching element SW94 pulls the second reference terminal 914 of the external reference control circuit 190 to GND to turn off the NMOS transistor T10. One end of the switching element SW92 is coupled to the reference input voltage source Vin Ref and another end of the switching element SW92 is coupled to the gate terminal 904 of the NMOS transistor T10. In addition, one end of the switching element SW94 is coupled to the gate terminal 904 of the NMOS transistor T10 and another end of the switching element SW94 is coupled to GND.

The switching elements SW91 and SW92 function as pass transistors to allow the reference input voltage source Vin Ref to connect to the sensing circuit 210D, when the external enable EN is in HIGH state. For example, the switching elements SW91 and SW92 may be implemented with transmission gates. Alternatively, the switching element SW91 may be implemented with a PMOS transistor controlled by the inverted external enable ENB. In addition, the switching element SW92 may be implemented with a NMOS transistor controlled by the external enable EN. The switching elements SW93 and SW94 function as reference reset transistors to properly terminate the sensing circuit 210D, when the external enable EN is in LOW state. The switching element SW93 may be implemented with a PMOS transistor controlled by the external enable EN. Additionally, the switching element SW94 may be implemented with a NMOS transistor controlled by the inverted external enable ENB.

Figure 10:
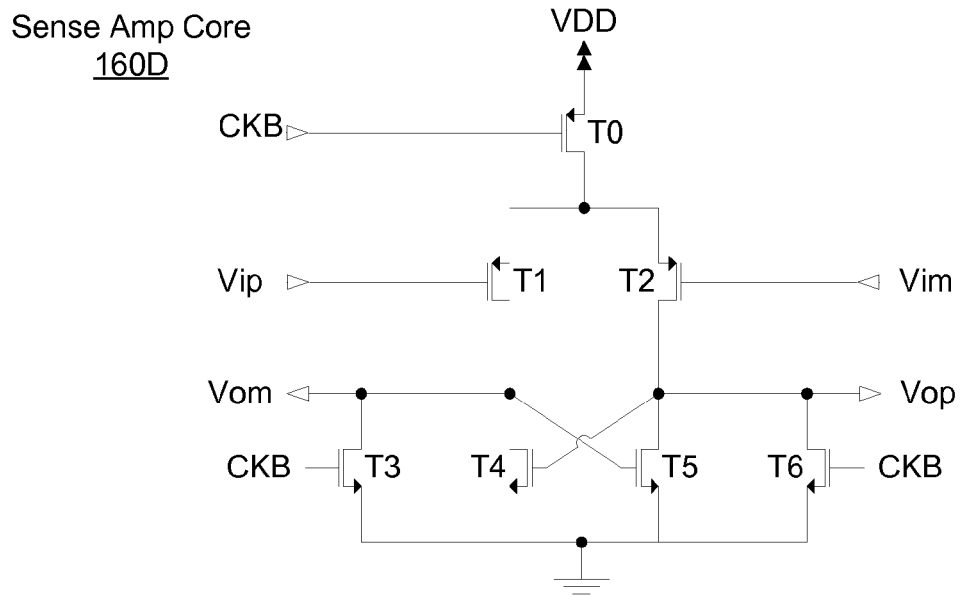
FIG. 10 is a circuit diagram illustrating a sense amplifier core circuit, according to one embodiment.

FIG. 10 illustrates one embodiment of a sense amplifier core circuit 160D. The sense amplifier core circuit is configured similar to the sense amplifier core circuit 160A of FIG. 5. The differences include the PMOS transistors T1 and T2 operating as the sensing circuits 210 replacing the PMOS transistors T7 and T8 operating as the regeneration current control circuits. The differences also include a lack of the sensing current control circuit 250. The operation of the sense amplifier core circuit 160D is also similar to the sense amplifier core circuit 160A, and therefore, the detailed description thereof is omitted herein for the sake of brevity. Because the sense amplifier core circuit 160D employs PMOS transistors T1 and T2 as the sensing circuit 210, the sense amplifier core circuit 160D operates with a low common voltage level.

Figure 11:
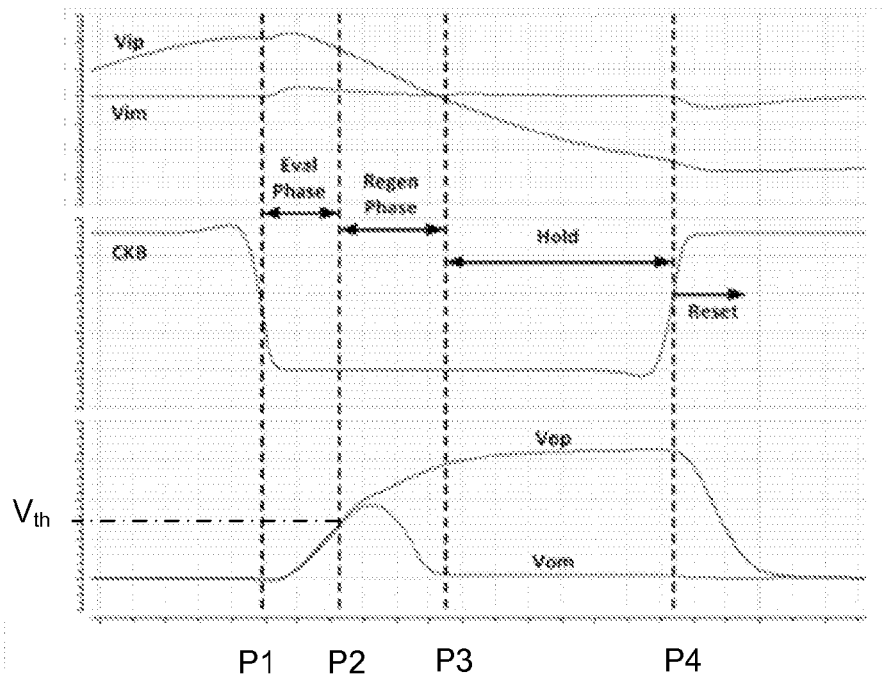
FIG. 11 is a timing diagram illustrating an example operation of the sense amplifier core circuit of FIG. 10, according to one embodiment.

FIG. 11 is a timing diagram of the embodiment of the sense amplifier core circuit 160D of FIG. 10. The operation of the sense amplifier core circuit 160D is similar to the sense amplifier core circuit 160A, and therefore, the detailed description thereof is omitted herein for the sake of brevity.

Figure 12:
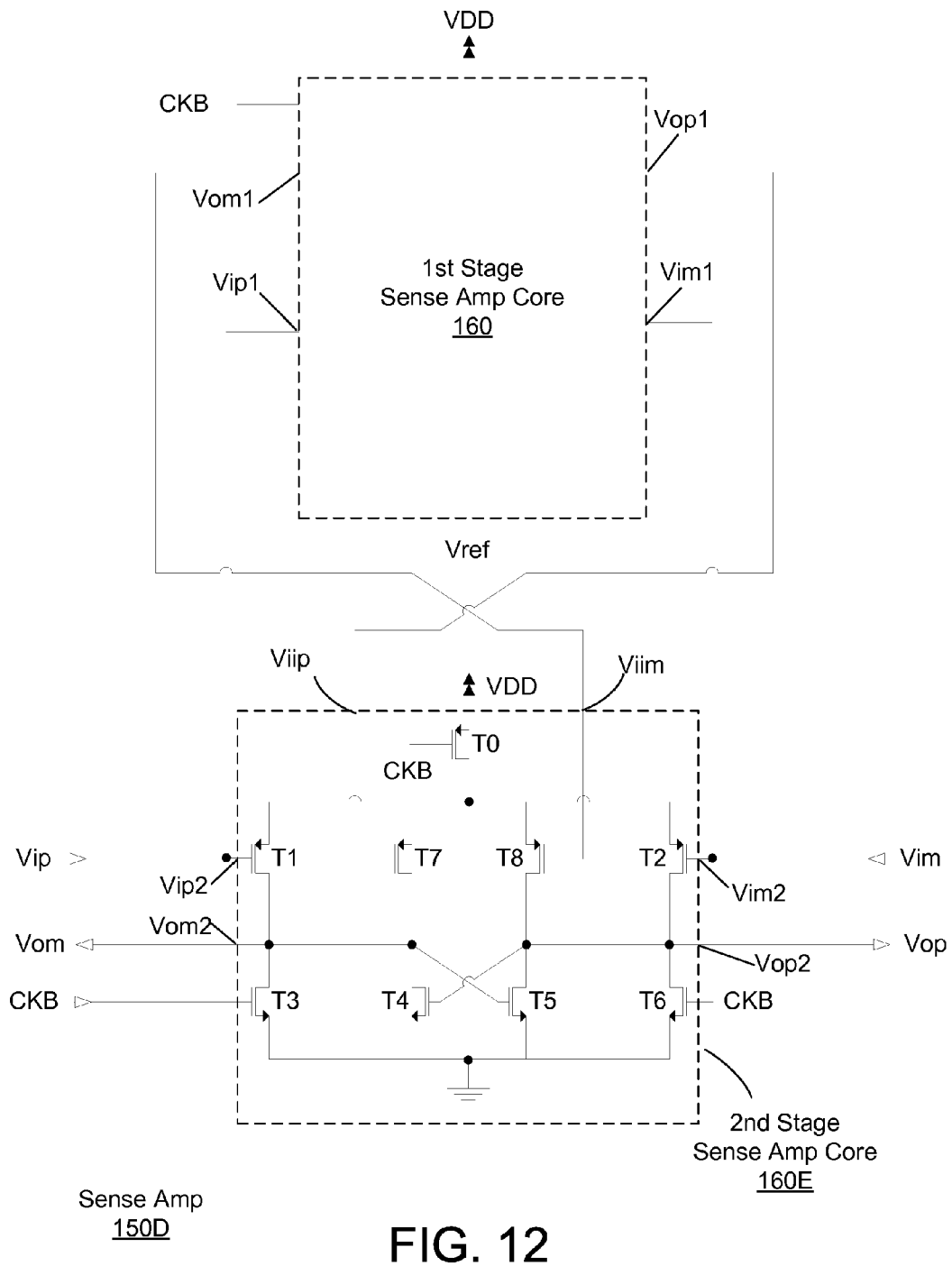
FIG. 12 is a circuit diagram illustrating a two stage sense amplifier, according to one embodiment.

FIG. 12 illustrates one embodiment of a two stage implementation of the sense amplifier 150D. The two stage implementation of the sense amplifier 150D utilizes two sense amplifier core circuits to provide additional positive feedback, thereby increasing the operation speed.

The sense amplifier 150D may include, among other components, a first stage sense amplifier core circuit 160, and a second stage sense amplifier core circuit 160E. The first stage sense amplifier core circuit 160 is similar to the sense amplifier core circuit 160 of FIG. 2. The second stage sense amplifier core circuit 160E implements similar features of the sense amplifier core circuit 160 of FIG. 2, and the sense amplifier core circuit 160D of FIG. 10. The second stage sense amplifier core circuit 160E comprises two auxiliary inputs: a positive auxiliary input Viip and a negative auxiliary input Viim. Both the first stage sense amplifier core circuit 160 and the second stage sense amplifier core circuit 160E operate based on the inverted clock signal CKB. The sense amplifier 150D receives differential inputs comprising a positive input signal Vip and a negative input signal Vim. The positive input signal Vip of the sense amplifier 150D is coupled to a first positive input Vip1 of the first stage sense amplifier core circuit 160, and a second positive input Vip2 of the second stage sense amplifier core circuit 160E. The negative input signal Vim of the sense amplifier 150D is coupled to a first negative input Vim1 of the first stage sense amplifier core circuit 160, and a second negative input Vim2 of the second stage sense amplifier core circuit 160E.

The positive auxiliary input Viip is coupled to the positive output node Vop1 of the first stage sense amplifier core circuit 160, and the negative auxiliary input Viim is coupled to the negative output node Vom1 of the first stage sense amplifier core circuit 160. The positive output node Vop of the sense amplifier 150D is coupled to the positive output node Vop2 of the second stage sense amplifier core circuit 160E, and the negative output node Vom of the sense amplifier 150D is coupled to the negative output node Vom2 of the second stage sense amplifier core circuit 160E.

The first stage sense amplifier core circuit 160 senses the positive input signal Vip and the negative input signal Vim of the sense amplifier 150D, and amplifies the sensed input signal in the regeneration phase. The second stage sense amplifier core circuit 160E receives the amplified signal from the first stage sense amplifier core circuit 160 through the positive auxiliary input Viip and the negative auxiliary input Viim, and performs a first amplification (i.e., regeneration) in the regeneration phase. The second stage sense amplifier core circuit 160E also receives the positive input signal Vip and the negative input signal Vim of the sense amplifier 150D, and performs a second amplification in the regeneration phase. In this configuration, the first amplification and the second amplification in the second stage sense amplifier core circuit 160E enables regeneration process to be performed faster (i.e., enters the regeneration phase faster).

In one embodiment, the second stage sense amplifier core circuit 160E is similar to the sense amplifier core circuit 160 except that the gate terminals of the PMOS transistors T7 and T8 of the regeneration circuit 220 are coupled to the positive auxiliary input Viip and the negative auxiliary input Viim, respectively. Although the second stage sense amplifier core circuit 160E employs only the PMOS transistors T1 and T2 as the sensing circuit 210C, the sensing circuits 210A or 210B as described above with respect to FIG. 3A or 3B can be implemented.

Figures 13A, 13B:
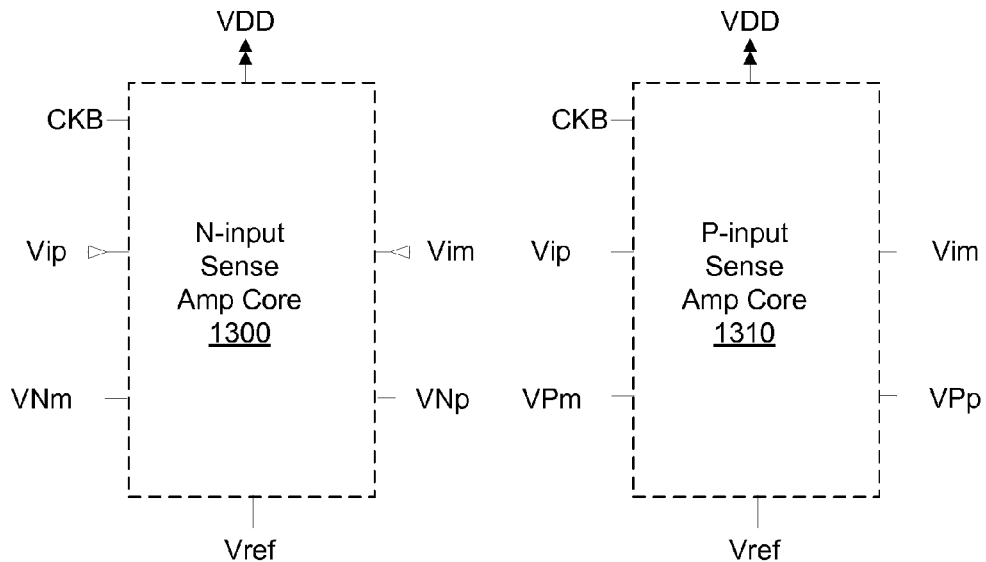
FIGS. 13A through 13C are block diagrams illustrating components employed in a complimentary input two stage sense amplifier circuit, according to one embodiment.
Figure 13C:
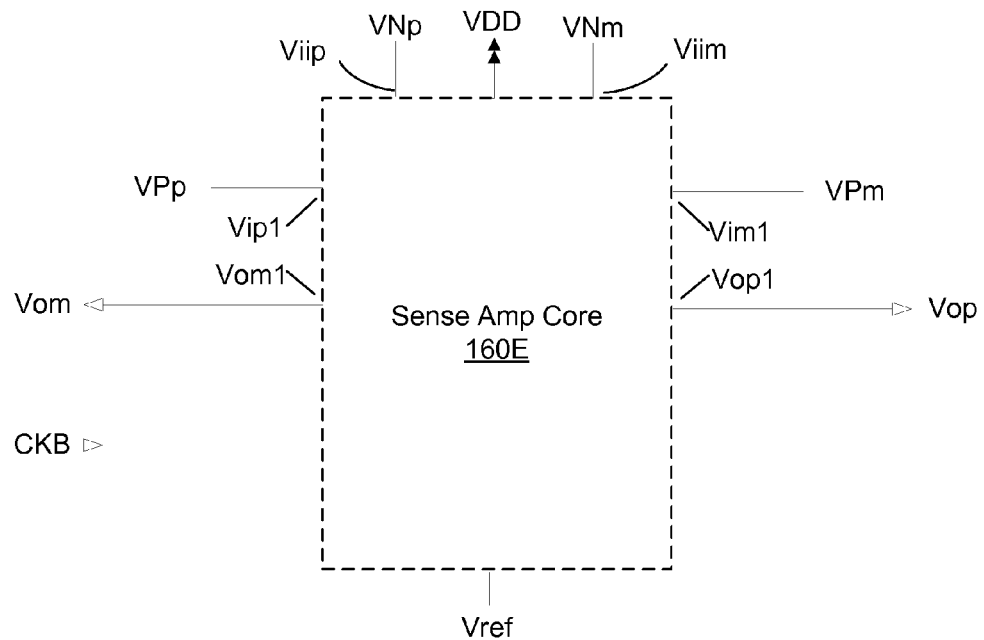

FIGS. 13A, 13B, and 13C illustrate a complimentary input two stage sense amplifier 150 with alternate symmetric input stages, according to one embodiment. The complimentary input two stage sense amplifier 150 comprises an N-input sense amplifier core circuit 1300 of FIG. 13A, a P-input sense amplifier core circuit 1310 of FIG. 13B, and a sense amplifier core circuit 160E of FIG. 13C. FIG. 13A illustrates the N-input sense amplifier core circuit 1300 implemented in the complimentary input two stage sense amplifier 150. The N-input sense amplifier core circuit 1300 is adapted to sense input signal Vin with a high common mode voltage level. FIG. 13B illustrates the P-input sense amplifier core circuit 1310 implemented in the complimentary input two stage sense amplifier 150 in conjunction with the N-input sense amplifier core circuit 1300 of FIG. 13A. The P-input sense amplifier core circuit 1310 is adapted to sense input signal Vin with a low common mode voltage level. FIG. 13C illustrates the sense amplifier core circuit 160E implemented in the complimentary input two stage sense amplifier 150 in conjunction with the N-input sense amplifier core circuit 1300 of FIG. 13A and the P-input sense amplifier core circuit 1310 of FIG. 13B. The sense amplifier core circuit 160E operates as an output combiner to combine outputs from the N-input sense amplifier core circuit 1300 and the P-input sense amplifier core circuit 1310. The N-input sense amplifier core circuit 1300 is similar to the sense amplifier core circuit 160 with the sensing circuit 210B comprising a NMOS transistor T9. In addition, the P-input sense amplifier core circuit 1310 is similar to the sense amplifier core circuit 160 with the sensing circuit 210C comprising a PMOS transistor T1. Alternatively, the P-input sense amplifier core circuit 1310 may be implemented as the sense amplifier core circuit 160D of FIG. 10.

The complimentary input two stage sense amplifier 150 receives differential inputs comprising a positive input signal Vip and a negative input signal Vim. The positive input signal Vip of the sense amplifier 150 is coupled to a positive input Vip of the N-input sense amplifier core circuit 1300, and a positive input Vip of the P-input sense amplifier core circuit 1310. The negative input signal Vim of the complimentary input two stage sense amplifier 150 is coupled to a negative input Vim of the N-input sense amplifier core circuit 1300, and a negative input Vim of the P-input sense amplifier core circuit 1310. In addition, the positive auxiliary input Viip of the sense amplifier core circuit 160E is coupled to the positive output node VNp of the N-input sense amplifier core circuit 1300, and the negative auxiliary input Viim of the sense amplifier core circuit 160E is coupled to the negative output node VNm of the N-input sense amplifier core circuit 1300. Moreover, the positive input Vip1 of the sense amplifier core circuit 160E is coupled to a positive output node VPp of the P-input sense amplifier core circuit 1310, and the negative input Vim1 of the sense amplifier core circuit 160E is coupled to a negative output node VPm of the P-input sense amplifier core circuit 1310. The positive output node Vop of the complimentary input two stage sense amplifier 150 is coupled to the positive output node Vop1 of the sense amplifier core circuit 160E, and the negative output node Vom of the complimentary input two stage sense amplifier 150 is coupled to the negative output node Vom1 of the sense amplifier core circuit 160E. In this configuration, the N-input sense amplifier core circuit 1300 alternate with the P-input sense amplifier core circuit 1310 to receive rail-to-rail input signal. In one embodiment, the sensing circuit 210B in the N-input sense amplifier core circuit 1300 and the sensing circuit 210C in the P-input sense amplifier core circuit 1310 employ thick-oxide devices to receive input signal Vin with high voltage swing range.

Operation of Sense Amplifier

Figure 14:
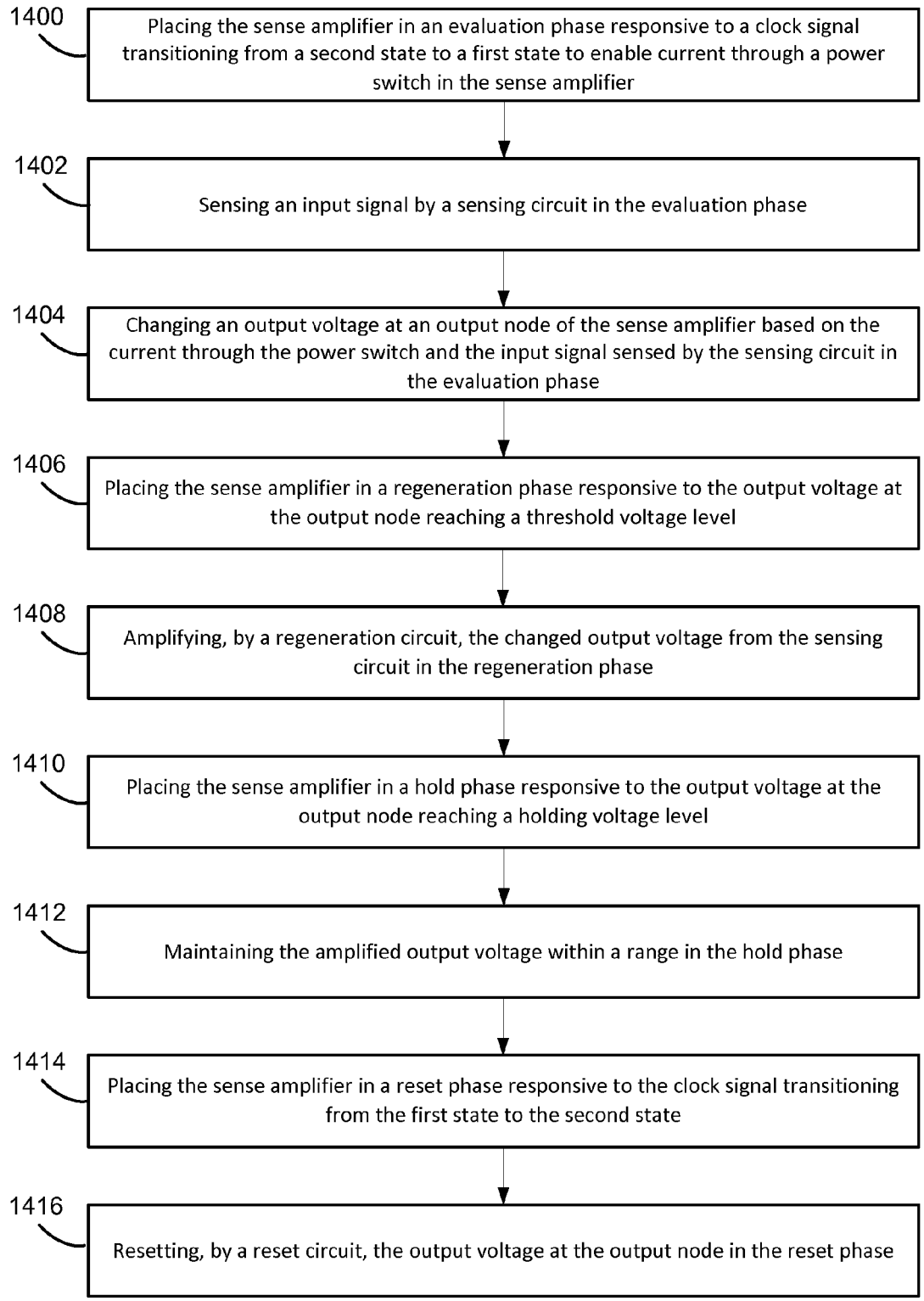
FIG. 14 is a flow chart illustrating sensing and amplifying an input signal by a sense amplifier, according to one embodiment.

FIG. 14 illustrates a flow chart of sensing and amplifying an input signal by a sense amplifier, according to one embodiment. The sense amplifier is placed 1400 in an evaluation phase responsive to a clock signal transitioning to a first state from a second state to enable current through a power switch in the sense amplifier.

The sense amplifier senses 1402 the input signal by a sensing circuit in the evaluation phase.

The sensing amplifier changes 1404 an output voltage at an output node of the sense amplifier based on the current through the power switch and the input signal sensed by the sensing circuit in the evaluation phase.

The sense amplifier is placed 1406 in a regeneration phase responsive to the output voltage at the output node reaching a threshold voltage level. The output voltage reaches the threshold voltage level based on the current through the power switch in the evaluation phase. The regeneration phase is subsequent to the evaluation phase.

The sense amplifier amplifies 1408 the changed output voltage from the sensing circuit by a regeneration circuit coupled in parallel to the sensing circuit and in series with the power switch in the regeneration phase.

The sense amplifier is placed 1410 in a hold phase responsive to the output voltage at the output node reaching a holding voltage level.

The sense amplifier maintains 1412 the amplified output voltage at the output node within a range in the hold phase.

The sense amplifier is placed 1414 in a reset phase responsive to the clock signal transitioning from the first state to the second state.

The sense amplifier resets 1416 the output voltage at the output node by a reset circuit.

Computing Machine Architecture

Figure 15:
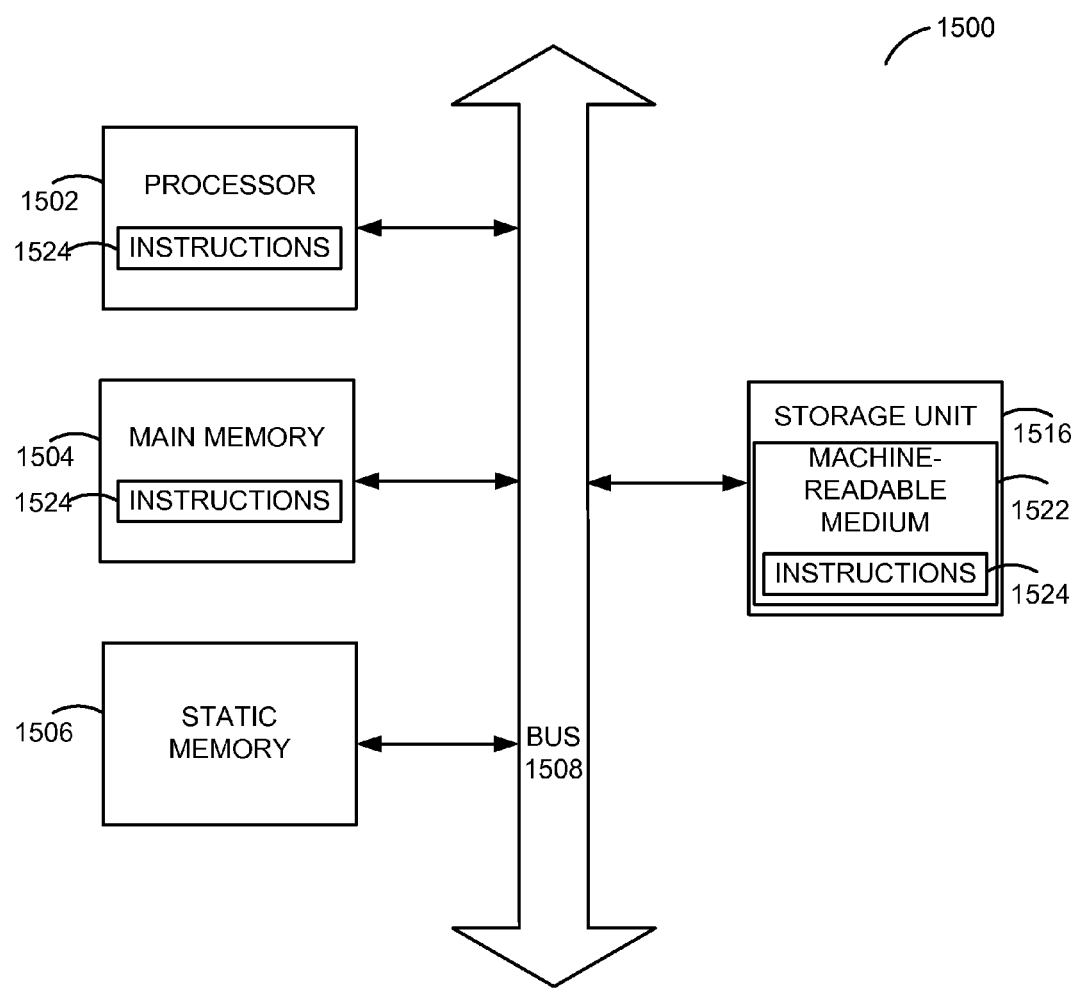
FIG. 15 illustrates a computer system for storing and loading a representation of circuit and/or system of a sense amplifier, according to one embodiment.

FIG. 15 is a block diagram of a computer system 1500 for executing electronic design automation (EDA) processes, according to one embodiment. Specifically, FIG. 15 shows a diagrammatic representation of a machine in the example form of a computer system 1500 within which instructions 1524 (e.g., software) for causing the machine to perform any one or more of the EDA processes discussed herein may be executed. The computer system 1500 operates as a standalone device or may be connected (e.g., networked) to other machines. In a networked deployment, the computer system 1500 may operate in the capacity of a server machine or a client machine in a server-client network environment, or as a peer machine in a peer-to-peer (or distributed) network environment.

The example computer system 1500 includes a processor 1502 (e.g., a central processing unit (CPU), a graphics processing unit (GPU), a digital signal processor (DSP), one or more application specific integrated circuits (ASICs), a main memory 1504, a static memory 1506, and a storage unit 1516 which are configured to communicate with each other via a bus 1508. The storage unit 1516 includes a machine-readable medium 1522 on which is stored instructions 1524 (e.g., software) embodying any one or more of the methodologies or functions described herein. The instructions 1524 (e.g., software) may also reside, completely or at least partially, within the main memory 1504 or within the processor 1502 (e.g., within a processor's cache memory) during execution thereof by the computer system 1500, the main memory 1504 and the processor 1502 also constituting machine-readable media.

While machine-readable medium 1522 is shown in an example embodiment to be a single medium, the term "machine-readable medium" should be taken to include a single medium or multiple media (e.g., a centralized or distributed database, or associated caches and servers) able to store instructions (e.g., instructions 1524). The term "machine-readable medium" shall also be taken to include any medium that is capable of storing instructions (e.g., instructions 1524) for execution by the machine and that cause the machine to perform any one or more of the methodologies disclosed herein. The term "machine-readable medium" includes, but not be limited to, data repositories in the form of solid-state memories, optical media, and magnetic media.

Circuit designs associated with sense amplifier described above may be stored in main memory 1504, static memory 1506 and/or storage unit 1516 in an electronic format. Such circuit designs may be combined with other circuit designs or incorporated into a design of a larger circuit by various EDA processes.

Additional Configuration Considerations

Embodiments of sense amplifier 150 are described above as operating by negative clock edge triggering. However, other embodiments may swap NMOS transistors with PMOS transistors, so that these embodiments operate based on positive clock edge triggering instead of negative clock triggering.

In addition, although the above embodiments are described using MOSFET as their active elements, different types of transistors or circuit elements such as bipolar junction transistor (BJT), heterojunction bipolar transistor (HBT), and FinFET can be used instead of MOSFET.

While particular embodiments and applications have been illustrated and described, it is to be understood that the disclosed embodiments are not limited to the precise construction and components disclosed herein. Various modifications, changes and variations, may be made in the arrangement, operation and details of the method and apparatus disclosed herein without departing from the spirit and scope defined in the appended claims.

What is claimed is:

1. A sense amplifier comprising:
    a power switch coupled between a first reference voltage source at a first voltage level and a second reference voltage source at a second voltage level lower than the first voltage level, the power switch configured to enable current to flow from the first reference voltage source to the second reference voltage source in the sense amplifier responsive to a clock signal placed in a first state;
    a sensing circuit coupled in series with the power switch, the sensing circuit configured to receive an input signal and change an output voltage at an output node based on the input signal during a period between a first time at which the clock signal transitions from a second state to the first state and a second time at which the output voltage reaches a threshold voltage level;
    a regeneration circuit coupled in parallel to the sensing circuit and in series with the power switch, the regeneration circuit configured to amplify the changed output voltage after the second time and before the clock signal transitions from the first state to the second state, the output voltage reaching the threshold voltage level based on the current flowing from the first reference voltage source to the second reference voltage source through the power switch; and
    a self clock control circuit configured to turn off the power switch responsive to the output voltage at the output node reaching a holding voltage level, the output node coupled to an input of the self clock control circuit and an output of the self clock control circuit coupled to a control terminal of the power switch.

2. The sense amplifier of claim 1, further comprising:
    a reset circuit coupled to the output node and configured to set the output voltage at the output node to a predetermined voltage level responsive to the clock signal placed in the second state.

3. The sense amplifier of claim 1, wherein the regeneration circuit is configured to amplify the changed output voltage after the second time without receiving another clock signal.

4. The sense amplifier of claim 1, wherein the sensing circuit comprises a transistor coupled to the output node in series with the power switch and configured to increase or decrease the output voltage based on the input signal.

5. The sense amplifier of claim 1, further comprising a sensing current control circuit coupled in series with the sensing circuit and configured to control a degree of change in the output voltage caused by operation of the sensing circuit.

6. The sense amplifier of claim 1, wherein the regeneration circuit comprises cross coupled transistors, and the output node is coupled to a regeneration port of the cross coupled transistors.

7. The sense amplifier of claim 6, wherein the regeneration circuit further comprises a regeneration current control circuit coupled in series with the power switch and the regeneration circuit, and configured to determine current through the regeneration circuit.

8. The sense amplifier of claim 1, further comprising:
    an assisted charging circuit coupled to the output node and configured to assist the output voltage reaching the threshold voltage level.

9. The sense amplifier of claim 1, further comprising:
    an external reference control circuit configured to provide a reference signal to the sensing circuit, the sensing circuit configured to change the output voltage based on the input signal and the reference signal.

10. The sense amplifier of claim 1, wherein the output node is coupled to an input of another sense amplifier to generate another output voltage at another output node of said another sense amplifier.

11. An electronic device comprising:
a sense amplifier comprising:
a power switch coupled between a first reference voltage source at a first voltage level and a second reference voltage source at a second voltage level lower than the first voltage level, the power switch configured to enable current to flow from the first reference voltage source to the second reference voltage source in the sense amplifier responsive to a clock signal placed in a first state;
a sensing circuit coupled in series with the power switch, the sensing circuit configured to receive an input signal and change an output voltage at an output node based on the input signal during a period between a first time at which the clock signal transitions from a second state to the first state and a second time at which the output voltage reaches a threshold voltage level;
a regeneration circuit coupled in parallel to the sensing circuit and in series with the power switch, the regeneration circuit configured to amplify the changed output voltage after the second time and before the clock signal transitions from the first state to the second state, the output voltage reaching the threshold voltage level based on the current flowing from the first reference voltage source to the second reference voltage source through the power switch; and
a self clock control circuit configured to disconnect the power switch by turning off a secondary switch responsive to the output voltage reaching a holding voltage level, the secondary switch coupled in series with the power switch, the output node coupled to an input of the self clock control circuit and an output of the self clock control circuit coupled to a control terminal of the secondary switch.

* * * * *